United States Patent [19]
Tonucci et al.

[11] Patent Number: 5,855,716
[45] Date of Patent: Jan. 5, 1999

[54] PARALLEL CONTACT PATTERNING USING NANOCHANNEL GLASS

[75] Inventors: Ronald J. Tonucci, Waldorf; Douglas H. Pearson, Laurel, both of Md.

[73] Assignee: The United States of America as represented by the Secretary of the Navy, Washington, D.C.

[21] Appl. No.: 725,211

[22] Filed: Sep. 24, 1996

[51] Int. Cl.[6] .......................... B44C 1/165; B32B 31/00; C08J 7/04; C23C 14/00

[52] U.S. Cl. .......................... 156/230; 156/232; 156/233; 156/247; 427/510; 427/531; 204/192.17; 204/192.22; 204/192.24; 204/192.25; 438/759; 65/411

[58] Field of Search .................................. 427/510, 531; 204/192.17, 192.2, 192.22, 192.24, 192.25; 438/575, 580, 759; 156/230, 232, 233, 239, 241, 247, 344; 65/411, 412

[56] References Cited

U.S. PATENT DOCUMENTS

| | | | |
|---|---|---|---|
| 5,264,722 | 11/1993 | Tonucci et al. | 257/443 |
| 5,306,661 | 4/1994 | Tonucci et al. | 437/90 |
| 5,332,681 | 7/1994 | Tonucci et al. | 437/16 |
| 5,597,613 | 1/1997 | Galarneau et al. | 427/162 |
| 5,635,008 | 6/1997 | Bianchi et al. | 156/247 |

OTHER PUBLICATIONS

Tonucci et al., "Nanochannel Array Glass", *Science* 258 783–85 (Oct. 30, 1992).

*Primary Examiner*—David A. Simmons
*Assistant Examiner*—J. A. Lorengo
*Attorney, Agent, or Firm*—Thomas E. McDonnell; John Karasek

[57] ABSTRACT

The present invention is a method for modifying a substrate in a predetermined pattern, comprising the steps of: (a) applying a material to the face of an etched nanochannel glass (NCG), where this face has a pattern of channels corresponding to the predetermined pattern, and (b) contacting the substrate with the etched NCG face having applied material, under conditions for transferring the material to the substrate.

21 Claims, 2 Drawing Sheets

PARALLEL CONTACT PATTERNING USING NANOCHANNEL GLASS

BACKGROUND OF THE INVENTION

1. Field of the Invention

The present invention is related to the use of nanochannel glass (NCG) in patterning a substrate with submicron (i.e., nanoscale) resolution, in parallel. More particularly, the present invention relates to using NCG to physically or chemically modify a substrate by transferring a material from the NCG to the substrate surface. The range of patterns which may be transferred to the substrate is limited only by the types of patterns that can be generated in an NCG sample.

2. Description of the Related Art

In complex structures, the relative placement of features is an important concern, along with the size and resolution of the features.

As used herein, "NCG" refers to a composite of different glasses, where these glasses are arranged in selected patterns. Typically, NCG will be a composite of two glasses, referred to as the "matrix glass" and the "etchable glass". Upon exposure to some agent(s) or condition(s), the etchable glass will dissolve or otherwise be removed, and the matrix glass will be unaffected, or at least minimally affected by these conditions. Such conditions include, but are not limited to, exposure to a solvent such as an acid, a base, or water. "Etched NCG" refers to the NCG that has been at least partially (and optionally completely) developed by exposure to an agent or condition that will differentially remove glass from the NCG, and "channel" refers to the voids created by this removal of glass, regardless of the geometry of these voids. It is this property of having the different glasses arranged in selected patterns, with high accuracy (ca. 0.5% of channel size), high precision (high repeatability), and small, controllable minimum feature sizes (ca. 10 nm or less), that distinguishes NCG from other composite glasses. Likewise, it is the property of having voids arranged in selected patterns that distinguishes etched NCG from other porous glasses (such as Vycor™).

It is desired to make a variety of patterns and structures. For example, it is a goal of the art to transfer patterned materials to substrates. These transferred materials may be used as patterned bi-layered materials, as masks for processing of substrates, and for other applications. It is frequently desired to pattern a substrate with metals (hard ferromagnetic, soft ferromagnetic, anti ferromagnetic, nonferromagnetic), semiconductors, insulators, superconductors, waxes, polymers, etc.

SUMMARY OF THE INVENTION

Accordingly, it is an object of this invention to modify a substrate with nanoscale resolution.

It is a further object of this invention to pattern a substrate, in parallel, with arbitrary patterns, including regular arrays and other patterns.

It is a further object of this invention to pattern a substrate with metals (including hard ferromagnetic, soft ferromagnetic, antiferromagnetic, and nonferromagnetic metals), semiconductors, insulators, superconductors, waxes, polymers, etc.

These and additional objects of the invention are accomplished by the structures and processes hereinafter described.

The present invention is a method for modifying a substrate in a predetermined pattern, comprising the steps of: (a) applying a material to the face of an etched nanochannel glass (NCG), where this face has a pattern of channels corresponding to the predetermined pattern, and (b) contacting the substrate with the etched NCG face having applied material, under conditions for transferring the material to the substrate.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Nanochannel glasses with preselected patterns will be made following techniques previously taught by the inventors. The following are incorporated by reference herein, in their entireties, for all purposes:

(a) U.S. Pat. No. 5,332,681, issued Jul. 26, 1994 to Tonucci et al. [Tonucci '681];

(b) U.S. Pat. No. 5,264,722, issued Nov. 23, 1993 to Tonucci et al. [Tonucci '722];

(c) U.S. Pat. No. 5,306,661, issued Apr. 26, 1994 to Tonucci et al. [Tonucci '661];

(d) Tonucci et al., "Nanochannel Array Glass", *Science* 258 783–85 (Oct. 30, 1992)

FIGS. 1, 2, 3, and 4 show examples of patterns that may be incorporated into an NCG sample for use in the present invention.

Figure 1:
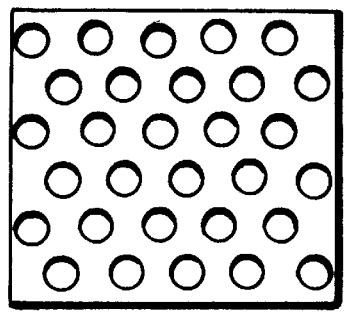
FIG. 1 shows a top view of an example etched NCG with a regular pattern, for use in the method of the invention.
Figure 2:
FIG. 2 shows a cross sectional view of an example partially developed etched NCG with a regular pattern, for use in the method of the invention.
Figure 3:
FIG. 3 shows a cross sectional view of an example completely developed etched NCG with a regular pattern, for use in the method of the invention.
Figure 4:
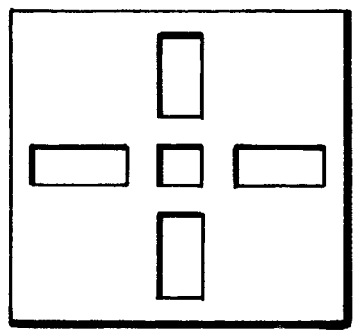
FIG. 4 shows a top view of an example etched NCG with an arbitrary pattern, for use in the method of the invention.
Figure 5:
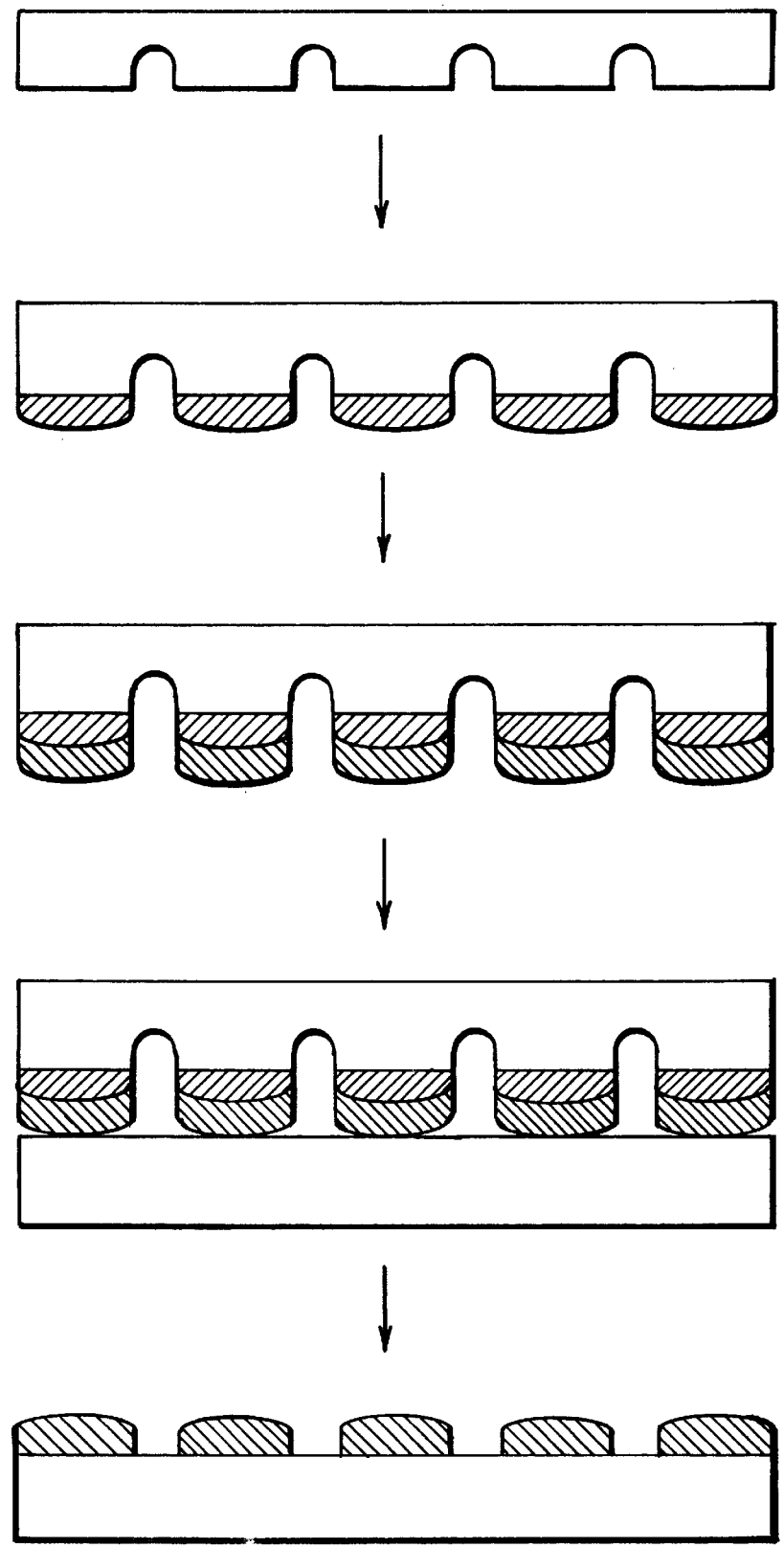
FIG. 5 is a block diagram of the method of the invention.

Referring to FIG. 5, the invention is preferably practiced as follows. A sample of NCG is polished and etched so that a face of the NCG has a pattern of channels corresponding to the pattern desired for the substrate. This NCG sample is typically a thin slice of NCG. In this context, "thin" means sufficiently thin to permit the glass to be deformed to conform to small deviations from flatness in the substrate, without breaking, but still retaining sufficient strength to permit the slice to be used in the process. Slices of NCG on the order of $\geq 5$ μm have been found to work well for the present invention. Typically, the pattern-bearing face of the NCG is polished to a high degree of flatness, using available glass polishing techniques. Alternatively, for a curved (concave or convex) substrate, the pattern-bearing face of the NCG is polished to fit (convex or concave) this curved substrate. As used herein, "convex" and "concave" indicate the sign of the curvature, and are not limited to particular geometries. Typically, the polishing step is performed before the channels in the NCG are developed (i.e., before the etchable glass is removed). Curvature may also be induced by bending the glass, which is relatively compliant if sliced sufficiently thin (e.g., a few μm). Alternatively, temperature and pressure conditions may be selected to provide compliance in the glass and/or the substrate. As another alternative, the substrate may be selected to be inherently compliant (e.g., polymers, waxes, etc.).

A material to be transferred to the substrate is applied to the pattern-bearing face of the etched NCG, so that this applied material carries the same pattern as the pattern-bearing face of the etched NCG (i.e., the etched NCG face acts as a master for the applied material). Depending on the particular applied material and the desired product, the method of applying the material to the pattern-bearing face of the etched NCG will vary.

A variety of techniques may be used to deposit the materials to be transferred to the substrate. These include line-of-sight (LOS) deposition techniques such as thermal evaporation, electron beam evaporation, molecular beam epitaxy, and laser ablation, nearly LOS techniques such as sputtering at low pressure, and non-LOS techniques such as chemical vapor deposition (CVD) and sputtering at high pressure. Practitioners will choose between these techniques for depositing metals (hard ferromagnetic, soft ferromagnetic, antiferromagnetic, non-ferromagnetic), semimetals, semiconductors, insulators, superconductors, etc.

The distinguishing factor between LOS and non-LOS deposition techniques in this context relates to the trajectories of the deposited atoms. In LOS techniques, the depositions usually take place at pressures of $10^{-5}$ torr and below, and the deposited atoms travel undeflected away from the source to the substrate in straight lines. In nearly LOS techniques, such as sputtering at low pressures, the deposited atoms suffer collisions with gas molecules and other atoms between the source and the substrate, and thus arrive at the substrate from a variety of directions. The nature of the trajectories, however, is still very much directional from the source to the substrate.

In non-LOS techniques, such as sputtering at high pressures and chemical vapor deposition, the deposited atoms arrive at the substrate with minimal directionality, coating all outer surfaces essentially uniformly.

After the material to be transferred to the substrate is coated onto the NGC, the coated etched NCG is contacted to the substrate, under conditions (including temperature, pressure, and ambient chemistry) that will effect the binding of the material to the substrate. By "binding", what is meant is a physical or chemical interaction between the substrate and the material to be bound, so that under use conditions (typically, ambient temperature, pressure, and chemical environment), the material remains bound to the substrate. This interaction may be in the form of a covalent or ionic bond, a diffusion bond, or adhesion, to name a few. If it is desired to remove the etched NCG from the substrate, binding also means the ability to remove the etched NCG without damage to the applied material or the substrate.

The type of binding interaction will of course depend on the particular substrate and the particular material for transfer to the substrate. For example, the particular substrate and transfer material may adhere to each other. Likewise, other transfer materials may diffuse into or react with various substrates. In the case where the transfer material diffuses into the substrate, the substrate and the transfer material may form a eutectic, which will be advantageous for some applications.

For most of the typical processes within the scope of the invention, the etched NCG/transfer material/substrate sandwich will be heated (or sometimes cooled) to an appropriate temperature. As used herein, the term "appropriate" heating or temperature embraces several concepts. In cases where it is desired to soften the etched NCG, to permit it to deform to fit the contours of the substrate, "appropriate" heating will entail heating the etched NCG to above its softening temperature. In cases where it is desired to have the transfer material react with the substrate, "appropriate" heating entails heating to a temperature where this reaction occurs at a desired rate.

In cases where it is desired to diffuse the transfer material into the substrate, "appropriate" heating entails heating to a temperature where this diffusion occurs at a desired rate. Such heating may be to a temperature where a eutectic forms between the substrate and the transfer material.

In cases where the binding mechanism between the substrate and the applied material is adhesion, no heating may be required.

A variety of heating methods are available for use in the present invention. A particularly desirable method of heating in the present invention is rapid heating, where samples heat from an initial temperature (typically room temperature) to a final temperature which may be from several hundred ° C. to greater than 1000° C. to 1200° C. over a time scale of seconds to tens of seconds. This is useful when significant diffusion between the substrate and the applied material is undesired. An example of rapid heating is rapid thermal annealing (RTA). Other available heating methods include laser heating (valuable when heating to 1000° C.–1200° C. over a time scale of $\mu$s to ns) and furnace heating. Another desirable method of heating in the present invention is slow heating, where samples heat from an initial temperature (typically room temperature) to a final temperature which may be from several hundred ° C. to greater than 1000° C. to 1200° C. over a time scale of hours or days.

Another preferred method of the invention entails the formation of an interfacial layer between the applied material and the substrate, by appropriate heating, pressure, etc. Such an interfacial layer may be, for example, or a Schottkey barrier contact.

Typically, some pressure will be applied to the coated NCG while the coated NCG is in contact with the substrate. This pressure will be less than a pressure that will break the NCG, but high enough to hold the NCG in place and to maximize contact between the applied material and the substrate.

Typically, the NCG will be removed after the applied material is transferred to the substrate. This removal may be accomplished by mechanically separating the etched NCG from the substrate/transfer material assembly, by chemically removing the etched NCG, or by exploitation of different coefficients of thermal expansion of the etched NCG and substrate by appropriate heating or cooling.

Optionally, a buffer material may be deposited in a layer between the pattern-bearing face of the etched NCG and the material to be transferred to the substrate. Such buffer layers typically will be used to facilitate the removal of the etched NCG from the material to be transferred to the substrate.

Typically, when a buffer layer is used, the material to be transferred to the substrate is applied to the etched NCG with an LOS (or nearly LOS) method. However, the buffer layer may be applied either by an LOS (or nearly LOS) method, or by a non-LOS method, such as chemical vapor deposition (CVD) or wet chemistry. In some cases, it may be advantageous to add the contact material by a non-LOS method.

Suitable buffer layer materials include metals such as aluminum, alloys that are soluble in acids or bases, polymers that are soluble in organic solvents, and various water soluble materials such as sodium metaphosphate, other salts, and hygroscopic glasses. Sodium metaphosphate, for example, is a highly effective buffer layer. Besides being water soluble, it has a number of advantages, including that it can be evaporated, and that it is typically amorphous when evaporated (and therefore there is not the problem of grain growth interfering with the sharpness of the buffer layer). Other water soluble buffer layer materials are sodium chloride, and other salts.

The patterning techniques described above entail a one-to-one correspondence between substrates and coated NCGs. This has the advantage of permitting global registration of features across a large substrate wafer. Alternatively, other patterning techniques entail the use of more than one coated etched NCG in patterning a substrate. For example, a plurality of coated NCGs may be brought into contact with a substrate (either concurrently or sequentially), and the transfer materials are transferred from the coated etched NCGs to the substrate. Alternatively, the same coated etched NCG may sequentially be brought into contact with different regions of the substrate. Such approaches are useful when several different transfer materials are desired on the same substrate, in the same or different regions of the substrate. Such methods are also useful for applications where global registration is less critical, since registration will be limited by the ability to position several coated etched NCGs with high precision.

Using the processes described herein, a person of ordinary skill in the art can make modified substrates with exceptional minimum feature size, packing density, total number of features, and patterned areas. Moreover, exceptional combinations of these features likewise can be obtained. For example, modified substrates with patterned areas that have at least $10^4$ features, typically at least $10^7$ features, more typically at least $10^8$ features, preferably at least $10^9$ features, more preferably at least $10^{10}$ features, still more preferably at least $10^{11}$ features, or most preferably at least $10^{12}$ features therein are attainable by the present invention. It is contemplated that modified substrates with $10^5$ features can be made by the present invention. Likewise, modified substrates with patterned areas that are at least 1" across, typically at least 2" across, more typically at least 4" across, preferably at least 6" across, more preferably at least 8" across, or most preferably at least 12" across are attainable by the present invention. For certain applications, 12" wafers are desired. Also, modified substrates with patterned areas that have local packing densities of at least $10^8$ features/cm$^2$, typically at least $10^9$ features/cm$^2$, more typically at least $10^{10}$ features/cm$^2$, preferably at least $10^{11}$ features/cm$^2$, more preferably at least $10^{12}$ features/cm$^2$, or most preferably at least $10^{13}$ features/cm$^2$ are attainable by the present invention. Also, modified substrates with patterned areas that have global packing densities of at least $10^3$ features/cm$^2$, typically at least $10^5$ features/cm$^2$, more typically at least $10^7$ features/cm$^2$, preferably at least $10^9$ features/cm$^2$, more preferably at least $10^{11}$ features/cm$^2$, or most preferably at least $10^{13}$ features/cm$^2$ are attainable by the present invention. It is contemplated that modified substrates with packing densities of $10^{13}$ features/cm$^2$ can be made by the present invention. Furthermore, modified substrates with patterned areas that have minimum feature sizes of submicron size, below 200 nm, typically below 100 nm, preferably below 50 nm, more preferably below 20 nm, or most preferably below about 10 nm are attainable by the present invention.

Having described the invention, the following examples are given to illustrate specific applications of the invention, including the best mode now known to perform the invention.

These specific examples are not intended to limit the scope of the invention described in this application.

EXAMPLE 1

A patterned Pt thin film bonded to a (100) Si substrate by a Si/Au eutectic bond was prepared. In this case, the NCG and therefore the patterned Pt thin film possessed a regular hexagonal pattern with circular pores approximately 650 nm in diameter. In the preparation of this sample, a thin slice of NCG (about 0.3 mm thick) was polished flat using diamond powder, and the acid-etchable glass was chemically removed by immersing the NCG in a dilute acid solution. The NCG was then rinsed, dried, and coated with approximately 100 nm of Pt using planar magnetron sputtering followed by an additional 60 nm coating of gold. The Si substrate was cleaned by sequentially rinsing in acetone and methanol. After drying, the Si substrate was dipped in a 25% by volume solution of hydrofluoric acid in DI water to remove the surface oxide layer and was then rinsed in DI water and dried. The coated side of the NCG was then placed on the Si substrate, and a stainless steel clip was used to hold the assembly in place. The assembly was then placed in a furnace under flowing argon gas at approximately 370° C. for 7 minutes. This temperature was chosen because it is slightly above the eutectic temperature of 363 ° C. at which the Au-Si interface liquefies. The assembly was then removed and allowed to cool to room temperature, and the NCG was mechanically separated from the Si, exposing patterned regions of Pt film attached to the Si substrate by the Au-Si eutectic bond.

EXAMPLE 2

As another example, a (110) Si substrate was patterned by chemically modifying its surface using a Pt-coated NCG with a hexagonal array of 8-micron circular voids. The NCG was polished, etched, and coated with 100 nm of Pt as described in the previous example. The coated side of the NCG was then placed in contact with the Si substrate, which had been rinsed sequentially in trichloroethylene, acetone, and methanol, and then dipped in 25% HF to remove the surface oxide. The NCG and Si substrate were then placed in a stainless steel clip, holding them together, and the assembly was placed in a furnace under flowing nitrogen gas and heated at approximately 600° C. for 65 minutes. This temperature was chosen near the softening point of the NCG to allow the NCG and the Pt film to conform to the substrate topology and promote good contact between the Pt and Si. The assembly was then removed from the furnace and allowed to cool to room temperature, and the NCG was mechanically separated from the Si. The Si substrate was then wet-chemically etched in a mixture of nitric acid (9 parts) and hydrofluoric acid (1 part) for 10 sec to elucidate the patterned surface modification. This etching step resulted in uniform, widespread Si pillars resulting from the Pt/NCG contact patterning and subsequent chemical etching. Thus, although a uniform film of platinum was not transferred to the substrate, a patterned, chemical modification of the surface had clearly occurred by diffusion.

PROPHETIC EXAMPLE 3

NaCl may be used as a buffer layer in the present invention to prepare a patterned Pt thin film bonded to a (100) Si substrate by a Si/Au eutectic bond.

Prepare an NCG as in Example 1. NaCl should be evaporated onto the etched NCG. After the NaCl is deposited, the etched NCG should be coated with approximately 100 nm of Pt using planar magnetron sputtering followed by an additional 60 nm coating of gold. Clean the Si substrate as in Example 1. Then place the coated side of the NCG on the Si substrate, and use a stainless steel clip to hold the assembly in place. Then place the assembly in a furnace under flowing argon gas and heat as in Example 1. Remove the assembly and allow it to cool to room temperature. Separate the etched NCG from the Si by dissolving the NaCl buffer layer with water, and thereby expose patterned regions of Pt film attached to the Si substrate by the Au-Si eutectic bond.

Obviously, many modifications and variations of the present invention are possible in light of the above teachings. It is therefore to be understood that, within the scope of the appended claims, the invention may be practiced otherwise than as specifically described.

What is claimed is:

1. A method for modifying a substrate in a predetermined pattern, comprising the steps of:

providing a sample of etched nanochannel glass (NCG), said etched NGC having a predetermined pattern disposed upon a face thereof;

applying a material to said patterned face;

providing a substrate to which material coated on said patterned NCG is to be transferred;

contacting said material coated patterned face of etched NCG with a face of said substrate; and providing conditions under which material coating on said patterned NCG is transferred and adhered to said substrate face.

2. The method of claim 1, wherein said etched NCG is etched from an NGC having acid etchable glass disposed in a more acid inert matrix glass.

3. The method of claim 1, further comprising the step of:

removing said etched NCG from said substrate after said contacting step without removing all of said applied material from said substrate.

4. The method of claim 3, wherein said step of removing said etched NGC comprises mechanically, chemically, or thermally removing said etched NCG.

5. The method of claim 1, further comprising the step of:

heating said etched NCG having said face in said contact to a temperature above a softening temperature for said etched NCG; and applying pressure to said etched NCG having said face in said contact, wherein said face deforms to conform to said substrate.

6. The method of claim 1, further comprising the step of:

heating at least a portion of said applied material on said face in said contact to a temperature wherein said applied material and said substrate interdiffuse at a measurable rate.

7. The method of claim 6, wherein said heating comprises heating to a temperature above a eutectic temperature for a mixture of said substrate and said applied material.

8. The method of claim 6, wherein said heating comprises a method selected from the group consisting of rapid heating, laser heating, and furnace heating.

9. The method of claim 6, wherein said heating comprises slow heating.

10. The method of claim 1, further comprising the step of:

heating at least a portion of said applied material on said face in said contact to a temperature wherein said applied material undergoes a chemical reaction with said substrate at a measurable rate.

11. The method of claim 1, further comprising the step of:

heating at least a portion of said applied material on said face in said contact to a temperature wherein said applied material adheres to said substrate.

12. The method of claim 1, wherein said a surface of said substrate in contact with said face is a curved surface.

13. The method of claim 1, wherein said a surface of said substrate in contact with said face is a flat surface.

14. The method of claim 1, wherein said applied material is selected from the group consisting of conductors, semiconductors, superconductors, insulators, metals, semimetals, alloys, waxes, and ceramics.

15. The method of claim 1, wherein said applied material comprises a polymer.

16. The method of claim 1, wherein said pattern has a submicron minimum feature size.

17. The method of claim 1, wherein said pattern has a minimum feature size less than about 100 nm.

18. The method of claim 1, wherein said pattern has a minimum feature size less than about 10 nm.

19. The method of claim 1, wherein said step of applying said material to said face of said sample of etched NCG comprises applying at least one material to faces of a plurality of samples of said etched NCG; and said step of contacting said substrate with said face comprises contacting said substrate with said faces of samples of etched NCG.

20. The method of claim 1, wherein said step of applying said material to said face of said sample of etched NCG comprises applying one material to a single face of a single sample of said etched NCG; and said step of contacting said substrate with said face comprises once contacting said substrate with said single sample of said etched NCG.

21. The method of claim 1, wherein said step of applying said material to said face of said sample of etched NCG comprises applying one material to a single face of a single sample of said etched NCG; and said step of contacting said substrate with said face comprises contacting said substrate with said single face of said single sample of said etched NCG a plurality of times.

* * * * *